United States Patent
Kemmerer et al.

(10) Patent No.: US 8,582,786 B2
(45) Date of Patent: Nov. 12, 2013

(54) AUTOMATIC GAIN CONTROL OF AMPLIFIER BY DYNAMIC SUPPRESSING AND OUTPUT CONTROL AT MULTIPLE STAGES

(75) Inventors: Jason Kemmerer, Torrance, CA (US); Patrik Boström, Ramlösa (SE)

(73) Assignee: Alpine Electronics, Inc., Tokyo (JP)

( * ) Notice: Subject to any disclaimer, the term of this patent is extended or adjusted under 35 U.S.C. 154(b) by 384 days.

(21) Appl. No.: 13/134,729

(22) Filed: Jun. 15, 2011

(65) Prior Publication Data
US 2012/0321104 A1    Dec. 20, 2012

(51) Int. Cl.
*H03G 3/00* (2006.01)
(52) U.S. Cl.
USPC .............. 381/107; 381/104; 381/55; 381/120
(58) Field of Classification Search
USPC .................................... 381/104, 107, 55, 120
See application file for complete search history.

(56) References Cited

U.S. PATENT DOCUMENTS

| | | | |
|---|---|---|---|
| 4,430,754 A * | 2/1984 | Ishigaki | 455/72 |
| 5,724,434 A * | 3/1998 | Myers | 381/108 |
| 6,151,400 A * | 11/2000 | Seligman | 381/317 |
| 2008/0008336 A1 | 1/2008 | Tanaka et al. | |

FOREIGN PATENT DOCUMENTS

JP    2003-174343    6/2003

* cited by examiner

*Primary Examiner* — Disler Paul
(74) *Attorney, Agent, or Firm* — Muramatsu & Associates

(57) ABSTRACT

A method and apparatus for automatic gain control of an amplifier in which the method and apparatus detects excessive increase in the sound volume or temperature rise in the audio system and reduces the gain of the amplifier by various means. Each gain control circuit has a comparator to compare a signal with threshold values and an integrator to integrate output signals of the comparator with respect to a predetermined time length to reduce a gain of the amplifier. The method and apparatus conducts dynamic suppressing of excess signals and thereby controlling output level of the amplifier at multiple stages without immediately shutting down the audio system. In the case where the sound volume increases to a degree that may damage the amplifier or speaker, a shutdown signal is generated to shutdown the operation of the whole system.

20 Claims, 8 Drawing Sheets

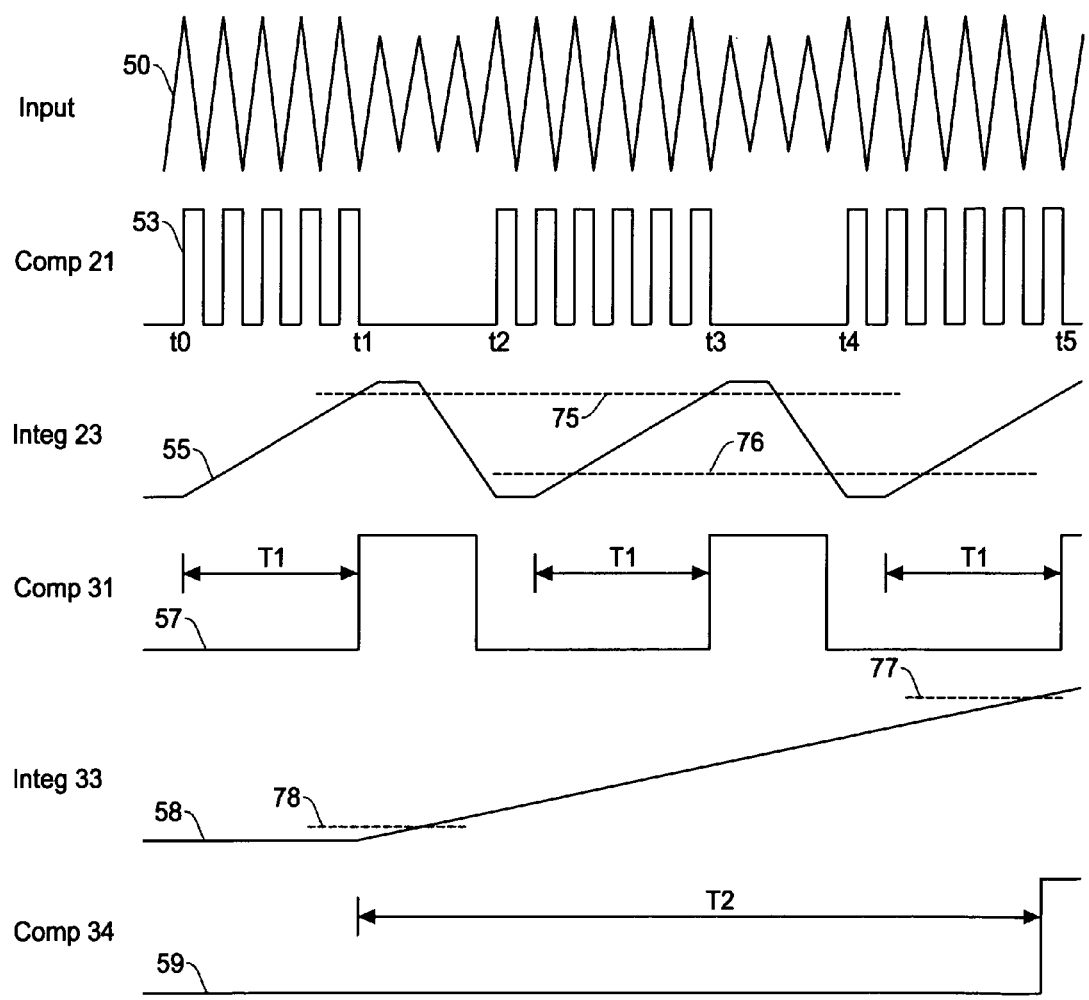

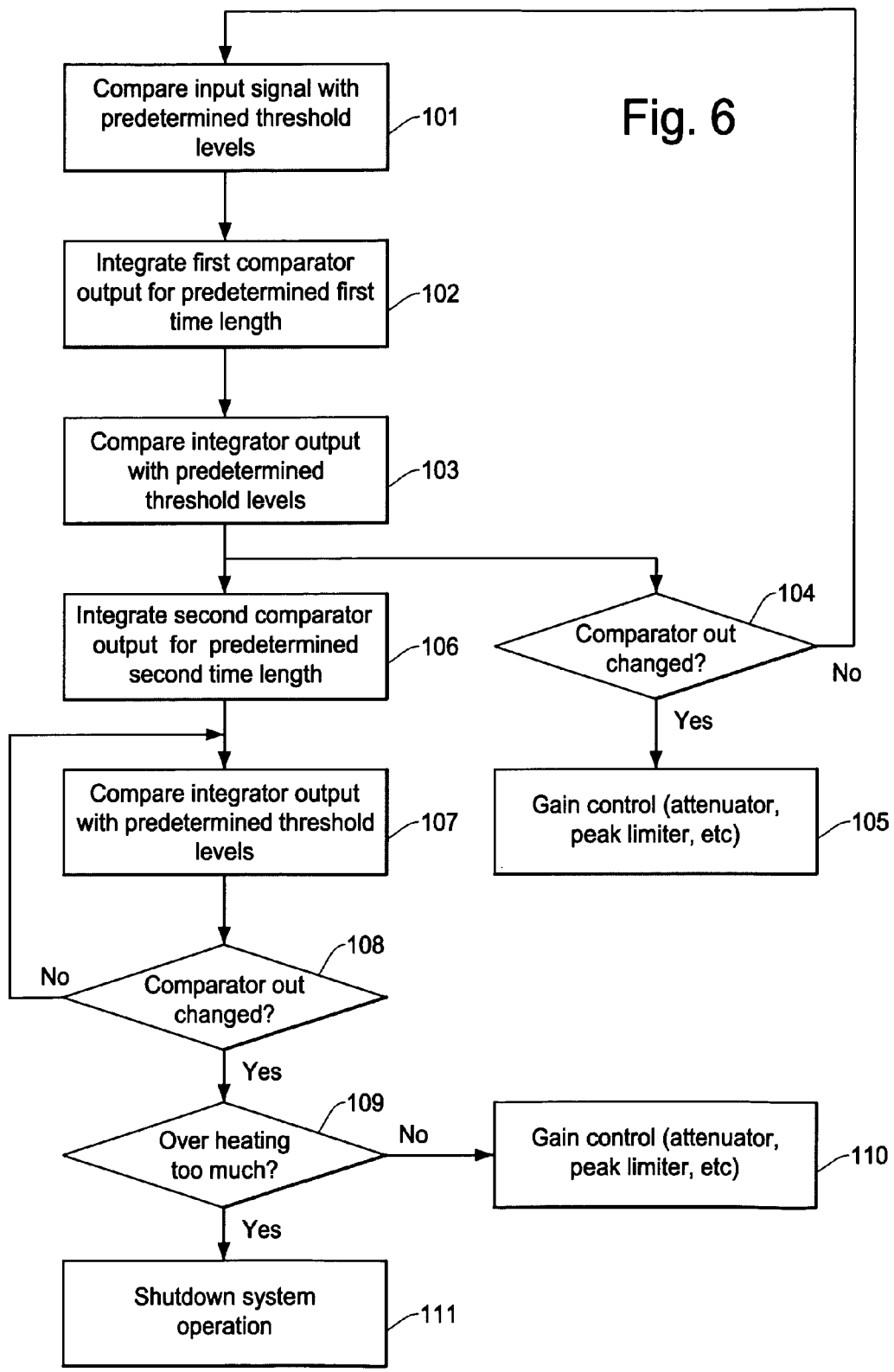

AUTOMATIC GAIN CONTROL OF AMPLIFIER BY DYNAMIC SUPPRESSING AND OUTPUT CONTROL AT MULTIPLE STAGES

FIELD OF THE INVENTION

This invention relates to a method and apparatus for automatic gain control of an amplifier, and more particularly, to a method and apparatus for automatic gain control of an amplifier of a loudspeaker by dynamic suppressing of excessive signals at multiple stages and thereby controlling the signal level of the amplifier.

BACKGROUND OF THE INVENTION

An automatic gain control circuit is widely used for an amplifier in an audio device such as a home audio system, car audio system, audio/video entertainment system, etc. to adjust the signal level associated with the amplifier. For example, a car audio system utilizes such an automatic gain control circuit with respect to a power amplifier to prevent overheating of a speaker as well as to avoid damages in the car audio system.

There are type of users who want to enjoy a very large volume of sound produced by such a car audio system when driving a car or otherwise using the car. Typically, such users specially mounts several loudspeakers in the car for large sounds including a subwoofer for bass sound. Power amplifiers for such loudspeakers and subwoofer are also installed in the car to produce large electric power so that very large sound of music, etc. can be produced by the car audio system.

A loudspeaker typically includes an acoustic transducer comprised of an electro-mechanical device which converts an electrical signal into acoustical energy in the form of sound waves. The acoustic transducer includes a voice coil which is a wire suspended between a pole piece and a permanent magnet and can oscillate in accordance with the reciprocal forces along the pole piece. The voice coil is attached to a cone shaped diaphragm which vibrates in response to the oscillation (reciprocal movement) of the voice coil. The vibration of the diaphragm produces acoustic energy in the air, i.e., a sound wave.

When an electrical signal is supplied to the voice coil, the electric current flowing therethrough generates heat because of resistance in the voice coil. Therefore, the temperature within the loudspeaker and its enclosure will increase. Additionally, when an amplifier for loudspeakers is driven at a range exceeding clipping points, an output of the amplifier is no longer linear or sinusoidal, which further heats up the amplifier and loudspeaker. Temperature rise in the voice coil increases the resistance of the voice coil, which results in a substantial portion of the input power of the loudspeaker to be converted to the heat, thereby lowering the efficiency and performance of the loudspeaker.

Such a loss of efficiency results in distortions of the reproduced sounds. When additional power is supplied to compensate for the increased resistance, additional heat is produced, again causes an increase in the resistance of the voice coil. At some point, any additional power input will be converted mostly into heat rather than acoustic output. Further, significant temperature rise can melt bonding materials in the voice coil or burn out the voice coil, resulting in permanent damage to the loudspeaker.

Therefore, it is necessary to limit the signal level from the amplifier that is input to the loudspeaker by means of the automatic gain control noted above. It is necessary that, when the user turns the volume of the amplifier extremely high and the temperature of the loudspeaker increases significantly, the automatic gain control dynamically adjusts the gain or signal level in the amplifier or output power level without shutting down the audio system so that the user can still enjoy the sounds. It is desired that the automatic gain control dynamically controls the signal level such as audio volume in a manner that is reliable as well as affordable. To protect the audio system from damage, it is also necessary to shutdown the system in a case where the user increases the sound volume too extreme for a long time that overheats the and may damage the audio system.

SUMMARY OF THE INVENTION

It is, therefore, an object of the present invention to provide a method and apparatus for automatic gain control of an amplifier which typically drives a loudspeaker.

It is another object of the present invention to provide a method and apparatus for automatic gain control of an amplifier by dynamic suppressing of excessive signals and thereby controlling the signal level of the amplifier at multiple stages.

It is a further object of the present invention to provide a method and apparatus for automatic gain control of an amplifier provided with a plurality of stages of gain control each having a comparator to compare a signal with threshold values, an integrator to integrate output signals of the comparator, and a timer to produce a signal for the gain control of the amplifier.

It is a further object of the present invention to provide a method and apparatus for automatic gain control of an amplifier which is able to quickly detect the excessive increase in the sound volume or temperature rise in the audio system and reduces the gain of the amplifier, thereby improving the reliability of the audio system.

It is a further object of the present invention to provide a method and apparatus for automatic gain control of an amplifier which is able to quickly detect the excessive increase in the sound volume or temperature rise in the audio system and shutdowns the audio system if such increase is too extreme or continue for a long time.

One aspect of the present invention is a method of controlling a signal level associated with an amplifier of an audio system where the amplifier includes a plurality of amplifier units. The method includes the steps of: comparing a signal level associated with a first amplifier unit of the amplifier by a first comparator with first threshold levels; integrating an output signal of the first comparator by a first integrator with a predetermined first time constant; establishing a first predetermined time length for detecting whether the signal level associated with the first amplifier unit is excessive for a time equal to or longer than the first predetermined time length; comparing an output voltage of the first integrator by a second comparator with second threshold levels and producing a comparator output when the output voltage of the first integrator reaches the second threshold level; reducing a gain of the first amplifier unit of the amplifier by a first gain control circuit when the second comparator produces the comparator output at an end timing of the first predetermined time length; integrating an output signal of the second comparator by a second integrator with a second predetermined time constant; establishing a second predetermined time length for detecting whether the output signal of the second comparator is excessive for a time equal to or longer than the second predetermined time length; comparing an output voltage of the second integrator by a third comparator with third threshold levels and producing a comparator output when the output voltage of the second integrator reaches the third threshold level; and reducing a gain of a second amplifier unit of the amplifier by a second gain control circuit when the third comparator produces the comparator output at an end timing of the second predetermined time length.

In the method of the present invention for controlling a signal level of the amplifier, the first predetermined time length is established by selecting values of the first time constant of the first integrator and the second threshold levels of the second comparator.

In the method of the present invention for controlling a signal level of the amplifier, the second predetermined time length is established by selecting values of the second time constant of the second integrator and the third threshold levels of the third comparator.

In the method of the present invention for controlling a signal level of the amplifier, the first predetermined time length is established by a digital timer and a high speed integrator in which the digital timer starts counting a clock signal when an output voltage of the high speed integrator reaches the threshold levels of the second comparator.

In the method of the present invention for controlling a signal level of the amplifier, the second predetermined time length is established by a digital timer and a high speed integrator in which the digital timer starts counting a clock signal when an output voltage of the high speed integrator reaches the threshold levels of the third comparator.

In the method of the present invention for controlling a signal level of the amplifier, the signal level is controlled by two stages of automatic gain control connected in series with one another in which the first stage of automatic gain control is configured by the first comparator, the first integrator, the second comparator, and the first gain control circuit, and the second stage of automatic gain control is configured by the second comparator, the second integrator, the third comparator, and the second gain control circuit.

In the method of the present invention for controlling a signal level of the amplifier, the second gain control circuit causes to shutdown the audio system when the output voltage of the second integrator exceeds a predetermined level for a predetermined time length to protect the audio system.

In the method of the present invention for controlling a signal level of the amplifier, the gain of the first amplifier unit is reduced in proportion to the amount of voltage held by the first gain control circuit or by a fixed attenuation rate when second comparator produces the comparator output.

In the method of the present invention for controlling a signal level of the amplifier, the gain of the first amplifier unit or the second amplifier unit is reduced by means of an attenuator, peak limiter, or changing an amount of power supply to the amplifier units.

In the method of the present invention for controlling a signal level of the amplifier, the first amplifier unit and the second amplifier unit are connected in series directly or indirectly and constitute the amplifier to drive a speaker of the audio system.

Further aspect of the present invention is an apparatus for automatically controlling a signal level of the amplifier of an audio system. The apparatus conducts the automatic gain control operation by dynamic suppressing of excess signals and thereby controlling output level of the amplifier at multiple stages without immediately shutting down the audio system so that the user can still enjoy the sounds. In the case where the user increases the sound volume to a degree that may damage the amplifier or speaker, the apparatus produces a shutdown signal to shutdown the operation of the whole system of the amplifier or audio system.

According to the present invention, the method and apparatus for automatic gain control of an amplifier detects excessive increase in the sound volume or temperature rise in the audio system and reduces the gain of the amplifier by various means. The apparatus of the present invention includes multiple stages of automatic gain control each having a comparator to compare a signal with threshold values and an integrator to integrate output signals of the comparator to produce a signal for the gain control of the amplifier with respect to a predetermined time length. The method and apparatus conducts dynamic suppressing of excessive signal levels and thereby controlling output level of the amplifier at multiple stages without shutting down the audio system so that the user can still enjoy the sounds. In the case where the user increases the sound volume to a degree that may damage the amplifier or speaker, the method and apparatus also produces a shutdown signal to shutdown the operation of the whole system of the amplifier or audio system. Since it is able to prevent an unwanted degree of power consumption and temperature rise in the audio system, the present invention significantly improves the reliability of the audio system.

BRIEF DESCRIPTION OF THE DRAWINGS

FIGS. 2A-2C are waveform diagrams each showing an example of operation of the apparatus for automatic gain control shown in FIG. 1, where FIG. 2A shows a situation in which a signal in the amplifier exceeds the threshold level for a time longer than a predetermined time length, FIG. 2B shows a situation in which the signal in the amplifier exceeds the threshold level for a time shorter than the predetermined time length, and FIG. 2C shows a basic operational relationship between multiple stages of automatic gain control so that dynamic suppressing and output control operations are conducted in a form of multiple stages in accordance with the present invention.

FIG. 3A shows a circuit structure in which a time constant of the integrator is also used as a timer for detecting a time length of the overheating state with respect to the predetermined time length, and FIG. 3B shows a circuit structure in which a digital timer is incorporated for detecting a time length of the overheating state with respect to the predetermined time length.

FIG. 6 is a flow chart showing the operational steps of the method of the present invention for automatic gain control of the amplifier by dynamic suppressing and output control of signal levels involved in the amplifier.

DETAILED DESCRIPTION OF THE PREFERRED EMBODIMENT

The method and apparatus for automatic gain control of an amplifier of the present invention will be described with reference to the accompanying drawings. The automatic gain control apparatus and method for an amplifier of the present invention is designed to perform the gain control operation by dynamic suppressing of excess signals at multiple stages. Each stage of automatic gain control has a comparator to compare a signal for the amplifier with threshold values and an integrator to integrate the output of the comparator to detect whether a signal level in the amplifier exceeds a predetermined power level (threshold values). Each stage also includes a function of timer to detect a time length relative to the predetermined time length during which a signal level in the amplifier exceeds the predetermined power level.

If the signal level that exceeds the predetermined power level continues equal to or longer than the predetermined time length, a gain control circuit operates to decrease the gain of the amplifier so as to lower the signal level in the amplifier. If the signal level that exceeds the predetermined power level continues only a time period shorter than the predetermined time length, the gain of the amplifier remains the same. Depending on the amount of exceeding the predetermined value, the gain of the amplifier is decreased accordingly or, if necessary, the operation of the amplifier or audio system is finally shutdown.

Figure 1:
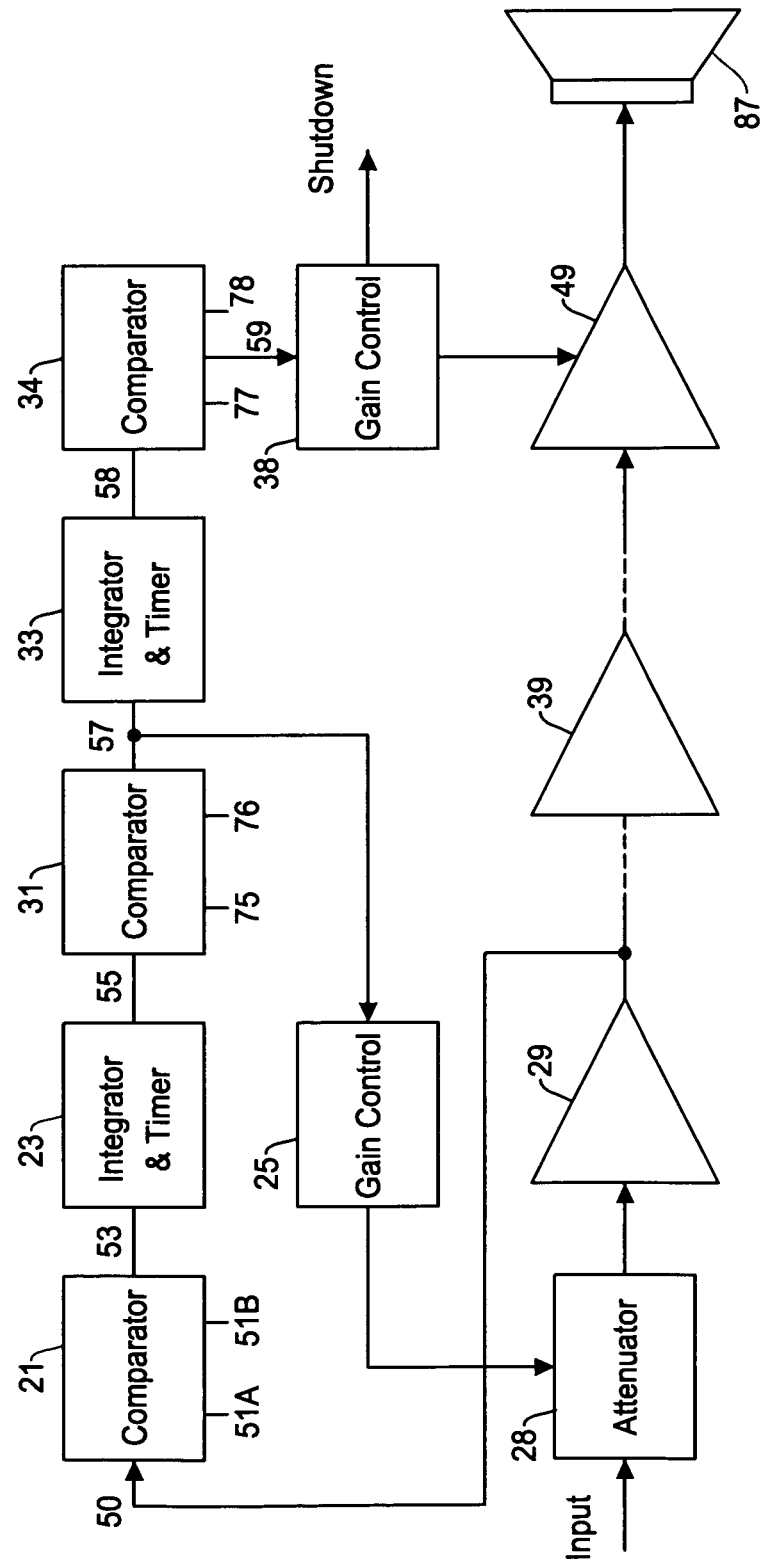
FIG. 1 is a schematic block diagram showing an example of configuration of an apparatus for automatic gain control of an amplifier by dynamic suppressing and output control in accordance with the present invention.

Referring to FIG. 1, an example of a basic configuration of the automatic gain control apparatus of the present invention by dynamic suppressing and output control of the amplifier signal level is described. As shown in the block diagram of FIG. 1, the automatic gain control apparatus of the amplifier is configured by a comparator 21, an integrator & timer 23, a gain control circuit 25, an attenuator 28, amplifier units 29, 39 and 49, a comparator 31, an integrator & timer 33, a comparator 34, a gain control unit 38, and a speaker 87. In FIG. 1, numerals at the inputs of the comparators and integrator & timers, etc., correspond to the waveforms shown in FIGS. 2A-2C, 3 and 4.

The (first) comparator 21 is provided with a high threshold level 51A and a low threshold level 51B as reference voltages to compare the incoming signal. The (second) comparator 31 is provided with a high threshold level 75 and a low threshold level 76 as reference voltages to compare the incoming signal. The (third) comparator 34 is provided with a high threshold level 77 and a low threshold level 78 as reference voltages to compare the incoming signal.

The example of automatic gain control apparatus in FIG. 1 shows a case where two stages of automatic gain control are incorporated in the amplifier to dynamically control the signal levels in the amplifier, i.e. an overall gain of the amplifier. The first stage of automatic gain control is configured by the comparator 21, the integrator & timer 23, the comparator 31, and the gain control circuit 25. The second stage of automatic gain control is configured by the comparator 31, the integrator & timer 33, the comparator 34, and the gain control circuit 38. Thus, the two stages of automatic gain control are series connected with one another and partially overlapped (comparator 31) with one another. Although only two stages are shown here for simplicity of description, it is apparent that three or more stages of automatic gain control can be used based on the concept of the present invention.

The amplifier units 29, 39 and 49 are connected in series and constitute an overall amplifier whose gain is to be automatically controlled, to drive the loudspeaker 87 such as a subwoofer. The amplifier units 29, 39 and 49 are shown here since an actual amplifier is generally configured by multiple stages of amplifier units. In an actual application, an amplifier may include more amplifier units and each amplifier unit can be an analog amplifier or a digital (logic) amplifier as well.

An input signal from an audio device, such as an FM receiver, is supplied to the amplifier unit 29 which typically has an attenuator at its front as indicated by the attenuator 28. The attenuator 28 is typically configured by a plurality of resistors and switches so that when a selected switch is driven, an attenuation ratio of the input signal changes. Accordingly, a signal level to the amplifier unit 29 changes so that the gain of the overall amplifier is controlled. As known in the art, the gain of the amplifier can be changed by other method as well such as controlling the power source voltage or current to the amplifier unit, controlling or limiting peak voltages of signals, selecting a winding ratio of transformer, etc.

In this example, an initial sense signal to the automatic gain control apparatus is retrieved from the output of the amplifier unit 29 although such a sense signal can be obtained from various points anywhere in the amplifier. As used herein, the term "initial sense signal" means an electric signal associated with the amplifier, typically, an audio signal propagating in the amplifier. The initial sense signal is also an input signal that is sensed by the first comparator 21 of the automatic gain control apparatus to determine a degree of controlling the gain of the amplifier.

As will be explained in more detail later, the integrator & timer 23 is structured to function as an integrator as well as a timer in combination with the comparator 31. Namely, the integrator & timer 23 integrates the output of the comparator 21 and also detects whether the input of the comparator 21 exceeds the threshold level of the comparator 21 for a time equal to or longer than a predetermined time length T1. To do this, a time constant of the integrator & timer 23 and the threshold level of the comparator 31 are selected to establish the predetermined time length T1 as a reference time length.

Similarly, the integrator & timer 33 is structured to function as an integrator as well as a timer in combination with the comparator 34. Namely, the integrator & timer 33 integrates the output of the comparator 31 and also detects whether the input of the comparator 31 exceeds the threshold levels of the comparator 31 for a time equal to or longer than a predetermined time length T2. To do this, a time constant of the integrator & timer 33 and the threshold level of the comparator 34 are selected to establish the predetermined time length T2 as a reference time length.

The gain control circuit 25 can be a buffer or a driver to activate the attenuator 28 to select the attenuation ratio based on the output of the comparator 31. The gain control circuit 38 can also be a buffer or a driver to control the gain of the amplifier unit 49 by, for example, changing the source voltage or current of the amplifier unit 49 or using other method noted above. If necessary, such as when the user sets the audio system to produce very large volume of sound for a long time to a degree that may damage the amplifier, speaker or audio system, the gain control circuit produces a shutdown signal to shutdown the overall operation of the audio system.

Typically, as noted above, the input sense signal is an audio signal which is an electric signal that will be eventually converted to an audible sound wave by the speaker 87 after being sufficiently increased its power level by the amplifier. In the example of FIG. 1, the initial sense signal at the output of the amplifier unit 29 is supplied to the comparator 21 of the first stage of automatic gain control. As is well known in the art, a comparator compares an input signal with high and low reference voltages (threshold levels) and produces an output signal when the input signal exceeds the threshold levels. Thus, in the (first) comparator 21, the input sense signal is compared with the high threshold level 51A and the low threshold level 51B.

Every time when the input sense signal exceeds the threshold levels 51A and 51B, the logic status of the output of the comparator 21 changes. An example of signal waveforms of the input sense signal and the output of the comparator 21 are shown in the schematic diagram of FIGS. 2A-2B and 3. A waveform 50 indicates a signal waveform of the input sense signal that is provided to the first comparator 21 from the output of the amplifier unit 29. As noted above, in this example, the amplifier unit 29 receives the input signal, typically an audio signal, through the attenuator 28.

Figure 2A:
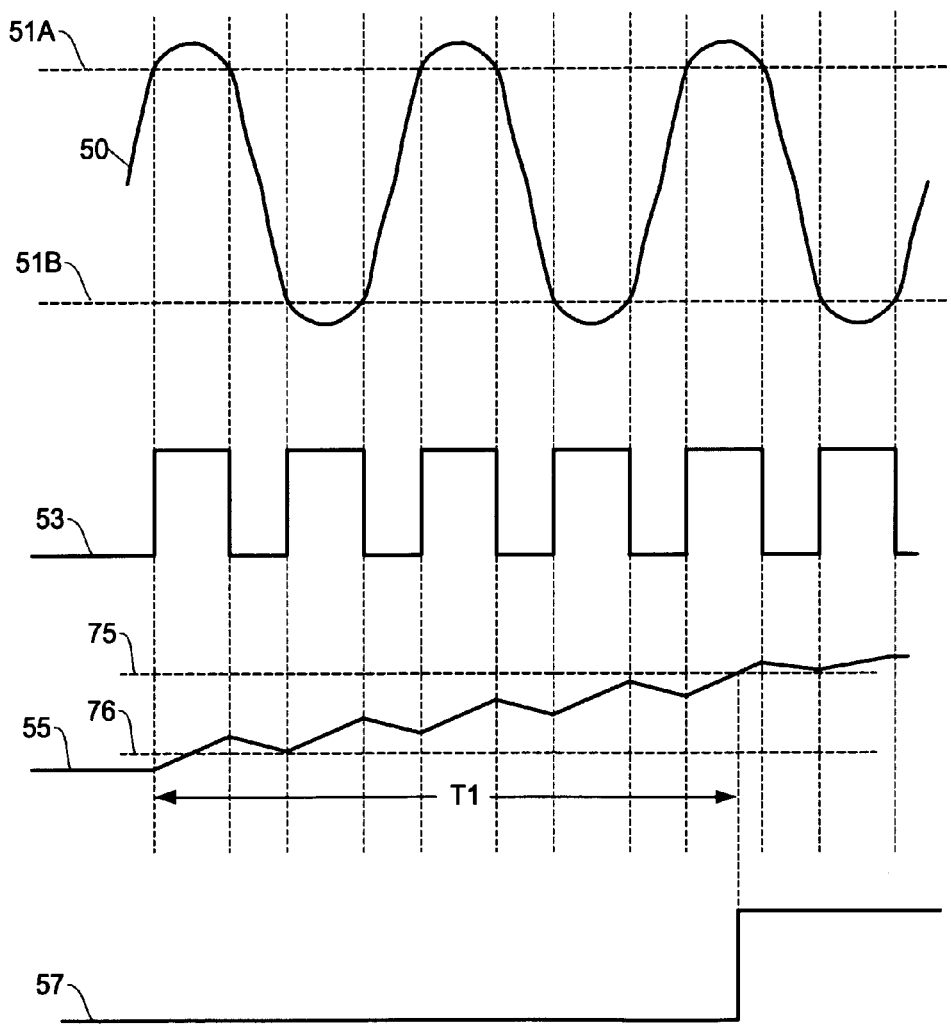
Figure 2B:
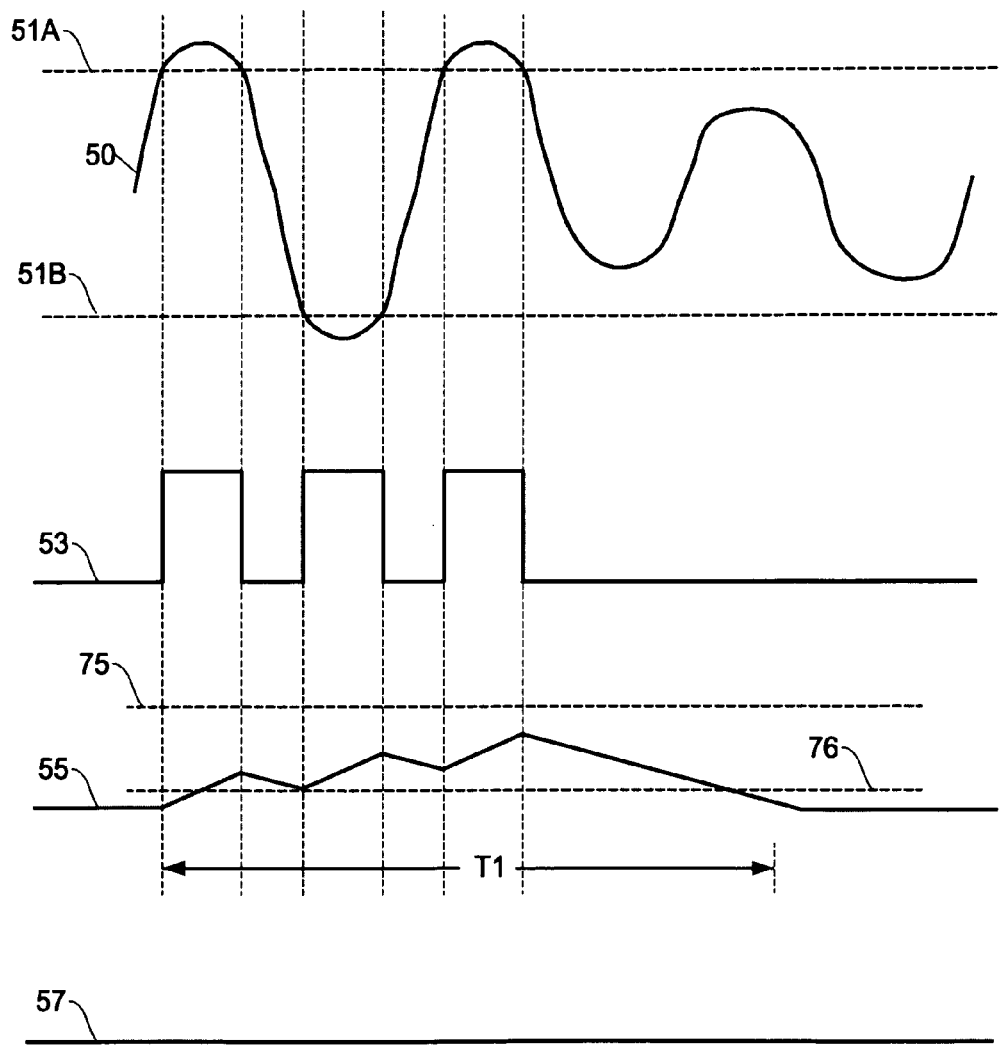

It is assumed that in the case of FIG. 2A, the input sense signal 50 keeps exceeding the threshold levels 51A and 51B longer than the predetermined time length T1. In the case of FIG. 2B, however, the input sense signal 50 exceeds the threshold levels 51A and 51B for only a time length shorter than the predetermined time length T1. FIGS. 2A and 2B, a waveform 53 shows an output (comparator output) of the comparator 21 corresponding to the situation of the input sense signal 50.

More specifically, as noted above, the high threshold level 51A and the low threshold level 51B are provided to the comparator 21 to determine whether the initial sense signal 50 exceeds such threshold levels. When the initial sense signal 50 goes high and exceeds the high threshold level 51A, the comparator output 53 will switch its state to turn-on as shown. When the initial sense signal 50 goes lower than the high threshold level 51A, the comparator output 53 will switch its output to turn-off.

When the initial sense signal 50 further goes down and exceeds the low threshold level 51B, the comparator output 53 will turn-on. When the initial sense signal 50 goes higher than the low threshold level 51B, the comparator output 53 will turn-off. As is known in the art, in the actual application, a comparator exhibits a hysteresis characteristics so that the turn-on and turn-off of the comparator operation will occur at slightly different points with respect to the threshold level, thereby preventing from being affected by noise, etc.

The integrator & timer 23 shown in FIG. 1 integrates the comparator output 53 from the comparator 21 so that it produces the integrator output 55 as shown in FIGS. 2A and 2B. As is known in the art, the integrator & timer 23 integrates the output voltage of the comparator output 53 with respect to time. Depending on the time constant of the integrator & timer 23, the integrator output 55 gradually changes during the transient period as shown in FIG. 2A until reaching the steady state which is an average voltage of the comparator output 53.

As noted above, in combination with the comparator 31, the integrator & timer 23 also functions as a timer to detect whether the input signal of the comparator 21 exceeds the threshold level of the comparator 21 for a time equal to or longer than the predetermined time length T1 or not. Namely, in this configuration, if the input signal repeatedly exceeds the threshold levels 51A and 51B of the comparator 21, the output of the comparator 21 shows many ups and downs, which increases the output voltage 55 of the integrator & timer 23 with a speed (or angle of rising the output voltage 55) determined by the time constant (i.e., resistance and capacitance values) of the integrator & timer 23.

In the example of FIG. 2A, since the input signal 50 to the comparator 21 keeps exceeding the threshold levels 51A and 51B, the output voltage 55 of the integrator & timer 23 keeps rising which may exceed the threshold level 75 of the comparator 31. Thus, by appropriately selecting the time constant of the integrator & timer 23 and the threshold level of the comparator 31, the time length T1 will be predetermined. In FIG. 2A, since the input signal 50 of the comparator 21 exceeds the threshold levels 51A and 51B of the comparator 21 for a time equal to or longer than the predetermined time length T1, the comparator 31 changes its output voltage (comparator output) 57 to a high level at the end timing of the predetermined time length T1. The high level of the output voltage 57 is used to drive the attenuator 28 through the gain control circuit 25 to reduce the input signal 50, i.e., the amplitude at the output of the amplifier unit 29.

Conversely, as in the case of FIG. 2B, if the input signal mostly does not exceed the threshold levels 51A and 51B of the comparator 21 but exceeds the threshold levels only for a shorter period of time, the output voltage 53 of the comparator 21 will not continue for a long time. Thus, in such a case, the output voltage 55 of the integrator & timer 23 decrease before reaching the threshold levels 75 of the comparator 31, i.e., the predetermined time length T1. Since the output voltage 55 of the integrator & timer 23 will not exceed the threshold level of the comparator 31, the output voltage 57 remains unchanged and the gain control circuit 25 stays the same, and thus, the attenuator 28, i.e., the gain of the amplifier is unchanged.

In other words, the output voltage level of the integrator & timer 23 represents the signal level and its time length (degree of power consumption) in the amplifier. Even though the signal level in the amplifier exceeds a critical level in terms of power consumption, if a time length of such an incident is short enough, the power consumption and temperature rise in the amplifier and loudspeaker is not a serious problem. However, the incident of exceeding the critical level continues for a long time or repeats frequently, the power consumption and temperature rise in the amplifier and loudspeaker can be a serious problem. Thus, the method and apparatus for automatic gain control of the amplifier under the present invention can be suitably implemented to solve the problems directed to the power consumption and heat-up in the audio system, etc.

In the example of FIG. 1, when the comparator output 57 from the comparator 31 goes high, the gain control circuit 25 drives the attenuator 28 so that the signal supplied to the amplifier unit 29 is decreased by a predetermined amount such as 6 dB. The attenuator 28 can be a voltage divider configured by a plurality of resisters where one or more resisters may be short-circuited by the output voltage of the gain control circuit 25 or may be variable resistance diodes whose resistance values will be changed by the output voltage of the gain control circuit 25, or etc. Upon receiving the output signal from the gain control circuit 25, the attenuator 28 decreases the signal passing therethrough toward the amplifier unit 29, thereby suppressing the signal level of the amplifier.

As noted above, the example of FIG. 1 shows the case where two stages of automatic gain control are incorporated in the amplifier to dynamically control the signal level in the amplifier, i.e. an overall gain of the amplifier. The first stage of automatic gain control is configured by the comparator 21, the integrator & timer 23, the comparator 31, and the gain control circuit 25. The operation of the first stage of automatic gain control is performed as described in the foregoing with reference to FIGS. 1 and 2A-2B.

The operation of the second stage of automatic gain control, which is similar to that of the first stage, is now described with reference to FIGS. 1 and 2C. As noted above, the second stage of automatic gain control is configured by the (second) comparator 31, the integrator & timer 33, the (third) comparator 34, and the gain control circuit 38. In the second stage of automatic gain control, the predetermined time length T2 is established by selecting the time constant of the integrator & timer 33 and the threshold level of the comparator 34 to monitor the output voltage 57 of the comparator 31.

With reference to FIG. 2C, suppose the input signal 50 to the comparator 21 constantly exceeds the threshold levels 51A and 51B of the comparator 21, the comparator 21 produces the output voltage 53 starting at time t0. In this situation, as noted above with respect to the first stage of the automatic gain control with reference to FIG. 2A, the integrator & timer 23 increases the output voltage 55 by the speed determined by its time constant. Then, the comparator 31 changes its output voltage 57 to the high level at the end timing of the predetermined time length T1.

The high level of the output voltage 57 is used to drive the attenuator 28 through the gain control circuit 25 to reduce the input signal 50, i.e., the amplitude at the output of the amplifier unit 29. Since the amplitude of the input signal 50 is reduced so as not to reach the threshold levels 51A and 51B of the comparator 21, an up-down movement of the output voltage 53 of the comparator 21 ends at time t1. Accordingly, the output voltage 55 of the integrator & timer 23 gradually goes down by the speed determined by its time constant.

Suppose the output voltage 57 of the comparator 31 goes to the low level at time t2 because of the downward movement of the output of the integrator & timer 23, the attenuator 28 is so driven by the gain control circuit 25 to return to the previous attenuation ratio. Thus, the input signal 50 (output of the amplifier unit 29) to the comparator 21 increases at time t2, which starts the up-down movement of the output voltage 53 of the comparator 21. Then, the integrator & timer 23 increases the output voltage 55 and the comparator 31 changes its output voltage 57 to the high level at the end timing of the predetermined time length T1 which reduces the level of input signal 50 at time t3.

This operation will be repeated as shown in FIG. 2C so that the signal level at the output of the amplifier unit 29, i.e, the gain of the amplifier is repeatedly adjusted. Namely, when the input signal 50 to the comparator 21 constantly exceeds the threshold levels 51A and 51B of the comparator 21, the gain of the amplifier is repeatedly adjusted. In the present invention, since the input signal 50 is repeatedly reduced because of the first stage of automatic gain control, it is possible to prevent the amplifier and loudspeaker from over-heating.

However, if the above noted situation continues for a long period of time, the operation by the first stage of automatic gain control may not be sufficient to prevent an unwanted degree of power consumption and temperature rise in the audio system because the long lasting temperature rise may damage the amplifier or loudspeaker. In the present invention, such a problem can be solved by the multiple stages of automatic gain control, which dynamically suppresses and controls the signal levels in the amplifier. As noted above, the example of FIG. 1 includes the second stage of automatic gain control which is configured by the by the comparator 31, the integrator & timer 33, the comparator 34, and the gain control circuit 38.

In the situation of FIG. 2C, the output voltage 57 of the comparator 31 goes up-and-down because of the operation of the first stage of automatic gain control as described above. Thus, the integrator & timer 33 integrates the output voltage 57 of the comparator 31 based on the time constant of the integrator which is typically larger (i.e., lower integration speed) than that of the integrator & timer 23. Thus, the output voltage 58 of the integrator & timer 33 slowly goes up as shown in FIG. 2C, which is compared by the comparator 34 with its threshold levels 77 and 78.

Namely, the comparator 34 detects whether the output voltage 58 of the integrator & timer 33 exceeds the threshold level 77 of the comparator 34 for a time equal to or longer than the predetermined time length T2. If so, a output voltage 59 of the comparator 34 goes to a high level at the end timing of the predetermined time length T2. As shown in FIG. 1, the gain control circuit 38 receives the output voltage 59 of the comparator 34 and reduces the gain of the amplifier unit 49, thereby preventing the amplifier and loudspeaker from further temperature rise.

The gain control circuit 38 can be a circuit similar to that of the gain control circuit 25, i.e., buffer or driver, or other circuit such as a logic circuit when the amplifier unit 39 is so configured that its gain can be controlled by a logic signal. For example, DSP based signal modification may be used for dynamic compression of the signal in the amplifier unit 39. In the case where the user increases the sound volume to a degree that far exceeds the predetermined level so that it may damage the amplifier or speaker, the gain control circuit 38 also produces a shutdown signal as shown in FIG. 1 to terminate the whole operation of the amplifier or the audio system.

The gain control operation can be conducted by various means. As noted above; in the first stage of the automatic gain control, upon receiving the output voltage 57 from the comparator 31, the gain control circuit 25 sends a signal to the attenuator 28 of the amplifier unit 29 to change the degree of attenuation by, for example, changing an impedance value therein. The attenuation ratio of the attenuator 28 is reduced in proportion to the amount of voltage held by the gain control circuit 25 or by a fixed attenuation rate such as 6 dB. In the second stage of the automatic gain control, upon receiving the output voltage 59 from the comparator 34, the gain control circuit 38 sends a signal to the amplifier unit 49 to limit the amplitude (peak) of the signal therein by, for example, changing a bias voltage of each limiter diode (not shown) in the amplifier unit 39. Alternatively, upon receiving the output voltage 59 from the comparator 34, the gain control circuit 38 sends a signal to the amplifier unit 49 to change the supply voltage or current by, for example, changing a duty cycle ratio of a signal that produces the supply voltage or current in the amplifier unit 49, thereby reducing the dynamic range of the amplifier unit 49 which results in the reduction of the signal level therein.

Thus, in the example of FIG. 1, the signal levels in the amplifier is monitored and if the level of the signal exceeds the predetermined level, the gain of the amplifier unit is decreased, limited or suppressed. In other words, the automatic gain control apparatus of FIG. 1 performs dynamic suppressing of the excessive signal level thereby controls the output of the amplifier to the speaker 87. The automatic gain control of the present invention dynamically adjusts the gain of the amplifier without shutting down so that the user can still enjoy the sounds produced by the loudspeaker. However, in the case where it is absolutely necessary to protect the audio system from damage, the automatic gain control apparatus of the present invention shutdowns the system.

Figure 3A:
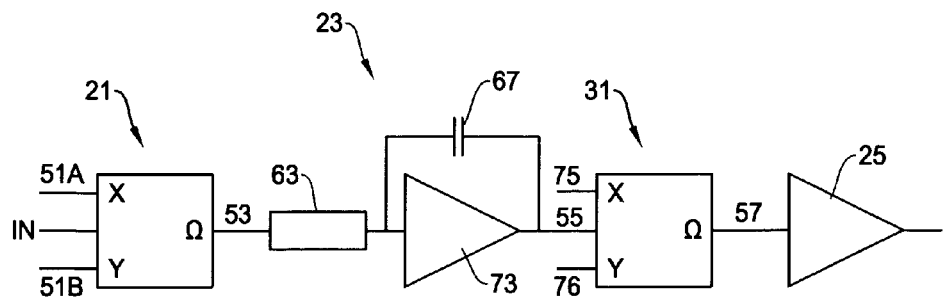
FIGS. 3A and 3B are schematic diagrams each showing an example of circuit structure of a comparator with the threshold settings, an integrator, a timer, and a gain control circuit, etc., in accordance with the present invention, where
Figure 3B:
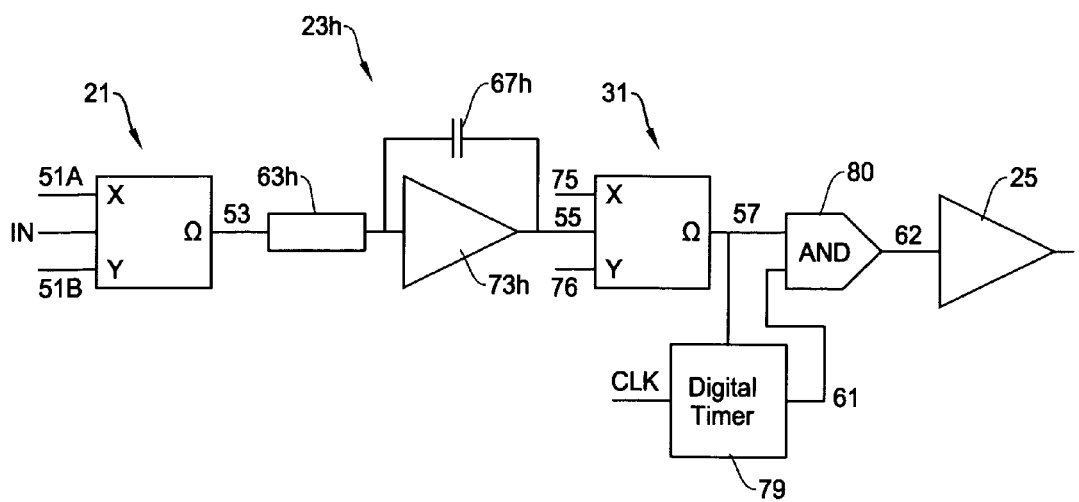

FIGS. 3A and 3B are schematic diagrams each showing an example of circuit structure of a comparator with the threshold settings, an integrator, a timer, and a gain control circuit, etc. that correspond to the block diagram of FIG. 1 in accordance with the present invention. FIG. 3A shows a circuit structure in which a time constant of the integrator is also used to function as a timer for detecting a length of the overloading state with respect to the predetermined time length. FIG. 3B shows a circuit structure in which a digital timer is incorporated for detecting a length of the overloading state with respect to the predetermined time length.

In FIGS. 3A and 3B, each of the comparators 21 and 31 may be configured by an operational amplifier, a dedicated voltage comparator, logic circuits, software means, etc. Here, the comparator 21 is configured by an analog IC available in the market where the high threshold level 51A and the low threshold level 51B are provided from reference voltage sources (not shown). Similarly, the comparator 31 is configured by an analog IC where the high threshold level 75 and the low threshold level 76 are provided. As is well known in the art, each of the comparators 21 and 31 is preferably optimized its hysteresis characteristics to achieve a stable operation against noise, etc.

In FIG. 3A, the integrator & timer 23 may be configured by an operational amplifier with a resister and a capacitor, a logic circuit available in the market, or a combination of only passive elements such as resisters and capacitors. In the example of FIG. 3A, the integrator 23 & timer is comprised of an operational amplifier 73, a resistor 63 and a capacitor 67. The performance such as a time constant of the integrator & timer 23 constructed as shown in FIG. 3 can be easily changed by selecting the values of the resistor 63 and the capacitor 67 to establish the predetermined time length T1 noted above in combination with the operation of the comparator 31. Thus, if the output voltage 55 of the integrator & time 23 reaches the threshold level 75 of the comparator 31 by the end timing of the predetermined time length T1, the output voltage 57 of the comparator 31 goes to high level. The output voltage 57 is transmitted to the amplifier unit 29 through the gain control circuit 25 to reduced the gain of the amplifier as described with reference to FIG. 2A.

In the example of FIG. 3B, rather than the integrator & timer 23, a high speed integrator 23h is employed which is comprised of a high speed operational amplifier 73, a resistor 63h and a capacitor 67h. In this case, the high speed integrator 23h is not used as a timer but is used only as an integrator. The high speed integrator 23h is designed for high speed integration of the output of the comparator 21, i.e., the time constant determined by values of the resistor 63h and the capacitor 67h is set much smaller than that of the integrator & timer 23 of FIG. 3A.

Thus, when the integration operation starts, the output voltage 55 of the high speed integrator 23h immediately reaches the final value. Accordingly, the comparator 31 also immediately changes its output voltage 57 (ex. from low to high) when the output voltage 55 of the high speed integrator 23h exceeds the threshold level 75 or 76. A digital timer 79 is provided which may be a down counter to receive the output voltage 57 of the comparator 31 and the clock signal CLK to establish the predetermined time length T1. An AND circuit 80 is also provided.

The digital timer 79 presets a value that corresponds to the predetermined time length T1 and upon receiving the output voltage 57 of the comparator 31, starts counting down the clock signal CLK. When the count result reaches the preset value (predetermined time length T1), the digital timer 79 produces an output signal 61 (ex. from low to high) at the end of the predetermined time length T1. Thus, if the output voltage 57 is still high level at this time, the output voltage 57 is transferred to the gain control circuit 25 through the AND circuit 80 as an output signal 62, thereby reducing the gain of the amplifier as described with reference to FIG. 2A.

Figure 4:
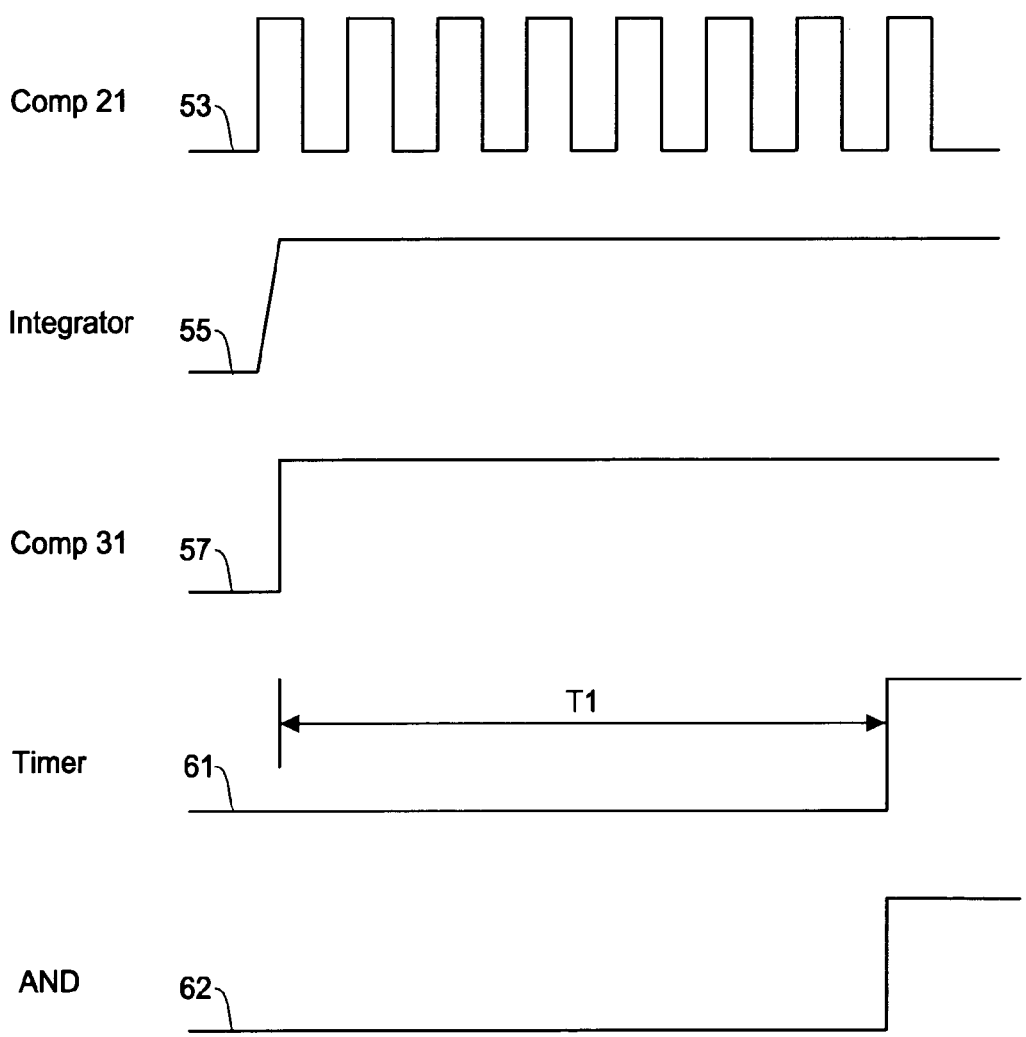
FIG. 4 is a waveform diagram showing an example of operation of the gain control circuit of FIG. 3B which is incorporating the digital timer in accordance with the present invention.

FIG. 4 is a waveform diagram showing an example of operation of the gain control circuit of FIG. 3B incorporating the digital timer in accordance with the present invention. Suppose the input to the comparator 21 constantly exceeds the threshold levels 51A and 51B, the output voltage 53 of the comparator repeats the up-down movement as shown in FIG. 4. Since the integrator 23h is designed for high speed operation in integrating the output voltage 53 of the comparator 21, its output voltage 55 immediately reaches the final level.

Thus, the comparator 31 also immediately changes its output voltage 57, from low to high, when the output voltage 55 of the high speed integrator 23h exceeds the threshold level 75 or 76. As noted above, the digital timer 79 is preset to establish the predetermined time length T1 and upon receiving the output voltage 57 of the comparator 31, starts counting the clock signal CLK. When the count result reaches the preset value, the digital timer 79 changes the output signal 61, from low to high, at the end of the predetermined time length T1. Thus, if the output voltage 57 of the comparator 31 is still high level at this time, the AND circuit 80 changes the output signal 62, from low to high, thereby reducing the gain of the amplifier through the gain control circuit 25.

Figure 5A:
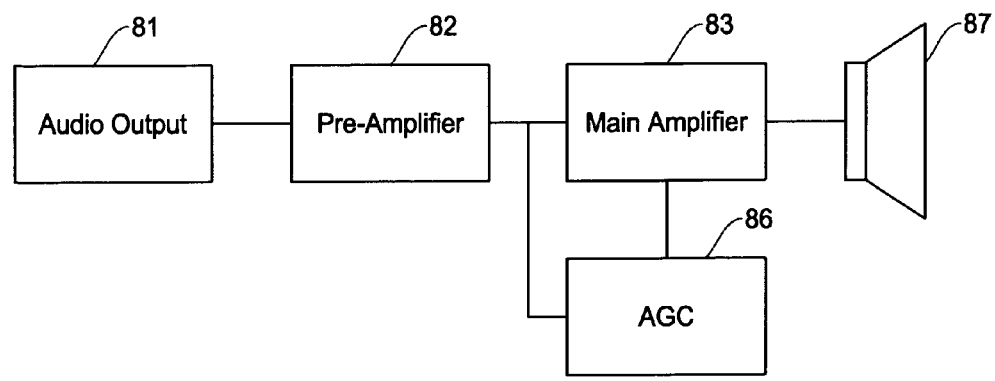
FIGS. 5A and 5B are schematic diagrams each showing an example of basic structure of the amplifier incorporating the automatic gain control of the present invention implemented in a vehicle audio system.
Figure 5B:
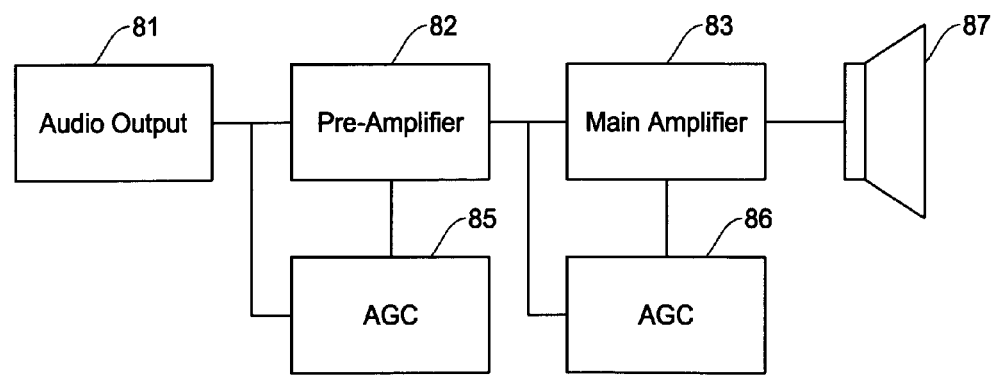

Referring to FIGS. 5A and 5B, the automatic gain control apparatus of the present invention for a vehicle audio system amplifier by dynamic suppressing and output control is described. In the vehicle audio system, some users prefer to reproduce the audio sound really loud by turning the volume knob to the maximum. However, as noted above, playing the audio at very high sound volume can damage the loudspeaker as well as the audio system including the amplifier due to the high temperature in the audio system caused by the heat dissipated by the high power consumption therein.

In FIGS. 5A and 5B, the amplifier is configured by a pre-amplifier 82 and a main amplifier 83 to drive the loudspeaker 87. The pre-amplifier receives an electric signal from an audio output device 81 which is eventually amplified by the amplifier to a sufficient level to drive the loudspeaker 87. The audio output device 81 is an audio device that produce an electric signal for audio sounds, for example, a CD player, an FM radio receiver, a DVD player, or any other device that reproduces audio signals.

Automatic gain control (AGC) circuits 85 and 86 detect the signal level of the amplifier and control the gain of the amplifier so as not to overly heat-up the vehicle audio system. Each of the automatic gain control circuits 85 and 86 is configured in the manner described with reference to FIGS. 1, 3A-3B and 4. Namely, each of the automatic gain control circuits 85 and 86 includes multiple stages of automatic gain control where each stage is configured by the first comparator, the integrator & timer, the second comparator, and the gain control circuit.

Thus, in the automatic gain control circuit 85, for example, two or more stages of automatic gain control are connected in series with one another and partially overlapped (ex. comparator 31) with one another as in the configuration of FIG. 1. Similarly, the automatic gain control circuit 86 may include two or more stages of automatic gain control which are connected in series with one another. As described in the foregoing, each stage of the automatic gain control establishes the predetermined time length unique to its stage to detect whether the signal levels in the amplifier are excessive for a time longer than the predetermined time length, if so, the gain of the corresponding amplifier unit is reduced.

In the example of FIG. 5A, the automatic gain control circuit 86 is provided to control the gain of the main amplifier 83. In the example of FIG. 5B, the automatic gain control circuit 86 is provided to control the gain of the main amplifier 83 and the automatic gain control circuit 85 is provided to control the gain of the pre-amplifier 82. As described above, the gain of the amplifier can be changed in various manners such as changing the attenuation ratio of the attenuator, limiting the amplitude of the signal by changing the peak limiter, suppressing the dynamic range of the amplifier by changing the power supply, etc. If the user persistently increases the sound volume of the vehicle audio system to a degree that may damage the vehicle audio system, the automatic gain control circuit 85 or 86 detects such extreme increase and produces a shutdown signal to shutdown the vehicle audio system.

FIG. 6 is a flow chart showing the operational steps of the method of automatic gain control with dynamic suppressing and output control of the present invention. The operational steps in this flow chart basically corresponds to the amplifier and the automatic gain control circuit of FIGS. 1 and 2A-2C. In step 101, the initial sense signal (input signal to the first comparator) is compared with the high and low threshold values. This step is conducted by the first comparator 21 described in the foregoing with reference to FIGS. 1, 2A-2B and 3A-3B.

In step 102, the output signal from the comparator is integrated for a predetermined time length T1. This step corresponds to the operation of the first integrator & timer 23 described with reference to FIGS. 1 and 2A-2B. As is well known in the art, the integrator gradually changes its output voltage based on the time constant by integrating the output voltage of the comparator. By selecting the time constant and the threshold levels of the (second) comparator 31, the first predetermined time length T1 can be established to determine whether the gain of the amplifier should be reduced or not. As also described with reference to FIG. 3B, the first predetermined time length T1 can be established and measured by a digital timer.

In the next step 103, the output voltage from the first integrator & timer is compared with the threshold level of the second comparator to check whether the excessive signal continues for a time equal to or longer than the first predetermined time length T1. This step corresponds to the operation of the comparator 31 shown in FIG. 1 in which the comparator 31 compares the output voltage 55 of the integrator & timer 23 with the threshold levels 75 and 76. Thus, in step 104, it is checked whether the comparator 31 changes its output signal from low to high, i.e. the output voltage 55 exceeds the threshold level of the comparator 31 at the end timing of the first predetermined time length T1.

If the (second) comparator 31 changes its output at the end timing of the first predetermined time length T1, in step 105, the gain of the amplifier is controlled, i.e., reduced in proportion to the amount of the gain control signal or by a fixed attenuation rate such as 6 dB. The amplifier gain is controlled or reduced by various means such as by an attenuator, peak limiter, voltage reduction of power supply, etc. In the step 104, if the comparator 31 does not change its output until the end timing of the first predetermined time length T1, the process goes back to the step 101 to repeat the foregoing procedure.

In step 106, the output signal from the second comparator is integrated by a second integrator. This step corresponds to the operation of the second integrator & timer 33 described with reference to FIG. 1. Similar to the combination of the integrator & timer 23 and the comparator 31, a second predetermined time length T2 is established by the combination of the second integrator & timer 33 and the (third) comparator 34 to determine whether the gain of the amplifier should be reduced or not. As also described with reference to FIG. 3B, the second predetermined time length T2 can be established and measured by the digital timer.

In step 107, the output voltage from the second integrator & timer is compared with the threshold level of the third comparator to check whether the excessive signal continues for a time equal to or longer than the second predetermined time length T2. This step corresponds to the operation of the (third) comparator 34 shown in FIG. 1 in which the comparator 34 compares the output voltage 58 of the integrator & timer 33 with the threshold levels 77 and 78. Thus, in step 108, it is checked whether the comparator 34 changes its output signal from low to high, i.e. the output voltage 58 exceeds the threshold level of the third comparator 34 at the end timing of the second predetermined time length T2.

In the step 108, if the comparator 34 does not change its output until the end timing of the second predetermined time length T2, the process goes back to the step 107 to repeat the procedure including the steps 107 and 108. If the comparator 34 changes its output at the end timing of the second predetermined time length T2, in step 109, it is determined whether the increase in the volume or temperature rise represented by the output voltage 58 of the second integrator & timer 33 is too much, i.e., a degree that may damage the amplifier or the speaker of the audio system.

For example, in a case where the comparator 34 changes its output from low to high many times, for example, more than a predetermined times, it may be judged that the temperature rise is too much. If the increase in the sound volume is not in the degree that needs the system shutdown, in step 110, the gain control unit 38 decreases the gain of the amplifier by various means such as by an attenuator, peak limiter, voltage reduction of power supply, etc. so that the user is able to continuously use the audio system. If it is determined that the increase in the sound volume is too much, the gain control unit circuit 38 produces a shutdown signal to shutdown the audio system in step 111.

As has been described above, according to the present invention, the method and apparatus for automatic gain control of an amplifier detects excessive increase in the sound volume or temperature rise in the audio system and reduces the gain of the amplifier by various means. The apparatus of the present invention includes multiple stages of automatic gain control each having a comparator to compare a signal with threshold values and an integrator to integrate output signals of the comparator to produce a signal for the gain control of the amplifier with respect to a predetermined time length. The method and apparatus conducts dynamic suppressing of excessive signal levels and thereby controlling output level of the amplifier at multiple stages without shutting down the audio system so that the user can still enjoy the sounds. In the case where the user increases the sound volume to a degree that may damage the amplifier or speaker, the method and apparatus also produces a shutdown signal to shutdown the operation of the whole system of the amplifier or audio system. Since it is able to prevent an unwanted degree of power consumption and temperature rise in the audio system, the present invention significantly improves the reliability of the audio system.

Although the invention is described herein with reference to the preferred embodiment, one skilled in the art will readily appreciate that various modifications and variations may be made without departing from the spirit and scope of the present invention. Such modifications and variations are considered to be within the purview and scope of the appended claims and their equivalents.

What is claimed is:

1. A method of controlling a signal level associated with an amplifier of an audio system where the amplifier includes a plurality of amplifier units, comprising the following steps of:

comparing a signal level associated with a first amplifier unit of the amplifier by a first comparator with first threshold levels;

integrating an output signal of the first comparator by a first integrator with a predetermined first time constant;

establishing a first predetermined time length for detecting whether the signal level associated with the first amplifier unit is excessive for a time equal to or longer than the first predetermined time length;

comparing an output voltage of the first integrator by a second comparator with second threshold levels and producing a comparator output when the output voltage of the first integrator reaches the second threshold level;

reducing a gain of the first amplifier unit of the amplifier by a first gain control circuit when the second comparator produces the comparator output at an end timing of the first predetermined time length;

integrating an output signal of the second comparator by a second integrator with a second predetermined time constant;

establishing a second predetermined time length for detecting whether the output signal of the second comparator is excessive for a time equal to or longer than the second predetermined time length;

comparing an output voltage of the second integrator by a third comparator with third threshold levels and producing a comparator output when the output voltage of the second integrator reaches the third threshold level; and reducing a gain of a second amplifier unit of the amplifier by a second gain control circuit when the third comparator produces the comparator output at an end timing of the second predetermined time length.

2. A method of controlling a signal level as defined in claim 1, wherein the first predetermined time length is established by selecting values of the first time constant of the first integrator and the second threshold levels of the second comparator.

3. A method of controlling a signal level as defined in claim 1, wherein the second predetermined time length is established by selecting values of the second time constant of the second integrator and the third threshold levels of the third comparator.

4. A method of controlling a signal level as defined in claim 1, wherein the first predetermined time length is established by a digital timer and a high speed integrator in which the digital timer starts counting a clock signal when an output voltage of the high speed integrator reaches the threshold levels of the second comparator.

5. A method of controlling a signal level as defined in claim 1, wherein the second predetermined time length is established by a digital timer and a high speed integrator in which the digital timer starts counting a clock signal when an output voltage of the high speed integrator reaches the threshold levels of the third comparator.

6. A method of controlling a signal level as defined in claim 1, wherein the signal level is controlled by two stages of automatic gain control connected in series with one another in which the first stage of automatic gain control is configured by the first comparator, the first integrator, the second comparator, and the first gain control circuit, and the second stage of automatic gain control is configured by the second comparator, the second integrator, the third comparator, and the second gain control circuit.

7. A method of controlling a signal level as defined in claim 1, wherein the second gain control circuit causes to shutdown the audio system when the output voltage of the second integrator exceeds a predetermined level for a predetermined time length to protect the audio system.

8. A method of controlling a signal level as defined in claim 1, wherein the gain of the first amplifier unit is reduced in proportion to the amount of voltage held by the first gain control circuit or by a fixed attenuation rate when second comparator produces the comparator output.

9. A method of controlling a signal level as defined in claim 1, wherein the gain of the first amplifier unit or the second amplifier unit is reduced by means of an attenuator, peak limiter, or changing an amount of power supply to the amplifier units.

10. A method of controlling a signal level as defined in claim 1, wherein the first amplifier unit and the second amplifier unit are connected in series directly or indirectly and constitute the amplifier to drive a speaker of the audio system.

11. An apparatus for automatically controlling a signal level associated with an amplifier of an audio system where the amplifier includes a plurality of amplifier units, comprising:

a first comparator with first threshold levels for comparing a signal level associated with a first amplifier unit of the amplifier;

a first integrator with a predetermined first time constant for integrating an output signal of the first comparator;

means for establishing a first predetermined time length for detecting whether the signal level associated with the first amplifier unit is excessive for a time equal to or longer than the first predetermined time length;

a second comparator with second threshold levels for comparing an output voltage of the first integrator and producing a comparator output when the output voltage of the first integrator reaches the second threshold level;

a first gain control circuit for reducing a gain of the first amplifier unit of the amplifier when the second comparator produces the comparator output at an end timing of the first predetermined time length;

a second integrator with a second predetermined time constant for integrating an output signal of the second comparator;

means for establishing a second predetermined time length for detecting whether the output signal of the second comparator is excessive for a time equal to or longer than the second predetermined time length;

a third comparator with third threshold levels for comparing an output voltage of the second integrator and producing a comparator output when the output voltage of the second integrator reaches the third threshold level; and a second gain control circuit for reducing a gain of a second amplifier unit of the amplifier when the third comparator produces the comparator output at an end timing of the second predetermined time length.

12. An apparatus for automatically controlling a signal level as defined in claim 11, wherein the first predetermined time length is established by selecting values of the first time constant of the first integrator and the second threshold levels of the second comparator.

13. An apparatus for automatically controlling a signal level as defined in claim 11, wherein the second predetermined time length is established by selecting values of the second time constant of the second integrator and the third threshold levels of the third comparator.

14. An apparatus for automatically controlling a signal level as defined in claim 11, wherein the first predetermined time length is established by a digital timer and a high speed integrator in which the digital timer starts counting a clock signal when an output voltage of the high speed integrator reaches the threshold levels of the second comparator.

15. An apparatus for automatically controlling a signal level as defined in claim 11, wherein the second predetermined time length is established by a digital timer and a high speed integrator in which the digital timer starts counting a clock signal when an output voltage of the high speed integrator reaches the threshold levels of the third comparator.

16. An apparatus for automatically controlling a signal level as defined in claim 11, wherein the signal level is controlled by two stages of automatic gain control connected in series with one another in which the first stage of automatic gain control is configured by the first comparator, the first integrator, the second comparator, and the first gain control circuit, and the second stage of automatic gain control is configured by the second comparator, the second integrator, the third comparator, and the second gain control circuit.

17. An apparatus for automatically controlling a signal level as defined in claim 11, wherein the second gain control circuit causes to shutdown the audio system when the output voltage of the second integrator exceeds a predetermined level for a predetermined time length to protect the audio system.

18. An apparatus for automatically controlling a signal level as defined in claim 11, wherein the gain of the first amplifier unit is reduced in proportion to the amount of voltage held by the first gain control circuit or by a fixed attenuation rate when second comparator produces the comparator output.

19. An apparatus for automatically controlling a signal level as defined in claim 11, wherein the gain of the first amplifier unit or the second amplifier unit is reduced by means of an attenuator, peak limiter, or changing an amount of power supply to the amplifier units.

20. An apparatus for automatically controlling a signal level as defined in claim 11, wherein the first amplifier unit and the second amplifier unit are connected in series directly or indirectly and constitute the amplifier to drive a speaker of the audio system.

* * * * *